United States Patent [19]
Lee et al.

[11] Patent Number: 5,751,540
[45] Date of Patent: May 12, 1998

[54] FERROELECTRIC CAPACITOR WITH RHODIUM ELECTRODES

[75] Inventors: June-key Lee, Suwon; Il-sub Chung, Seoul, both of Rep. of Korea; Seshu Babu Desu, Blacksberg, Va.

[73] Assignee: Samsung Electronics Co., Ltd., Rep. of Korea

[21] Appl. No.: 618,320

[22] Filed: Mar. 19, 1996

[30] Foreign Application Priority Data

Mar. 20, 1995 [KR] Rep. of Korea ............ 95-5783

[51] Int. Cl.⁶ ............................................. H01G 4/06
[52] U.S. Cl. ............ 361/321.4; 361/305; 361/321.2; 361/322; 357/295
[58] Field of Search ................. 361/321.1, 321.2, 361/321.3, 321.4, 321.5, 311, 312, 313, 305, 306.3, 303, 322; 29/25.42; 257/295, 296

[56] References Cited

U.S. PATENT DOCUMENTS

| | | | |
|---|---|---|---|
| 4,437,139 | 3/1984 | Howard | 361/313 |
| 4,982,309 | 1/1991 | Shepherd | 360/321 |
| 5,003,428 | 3/1991 | Shepherd | 361/321 |
| 5,191,510 | 3/1993 | Huffman | 361/313 |
| 5,262,920 | 11/1993 | Sakuma et al. | 361/321.5 |

*Primary Examiner*—Kristine L. Kincaid
*Assistant Examiner*—Anthony Dinkins
*Attorney, Agent, or Firm*—Rothwell, Figg, Ernst & Kurz

[57] ABSTRACT

A ferroelectric capacitor used as a memory cell in a ferroelectric random access memory (FRAM) is provided. The ferroelectric capacitor includes a substrate, an insulating layer formed on the substrate, a Rh lower electrode provided on the insulating layer, an adhesive layer between the insulating layer and the lower electrode, a ferroelectric layer provided on the lower electrode, and a Rh upper electrode provided on the ferroelectric layer. The Rh used as the electrode material is not affected by diffusion of Si due to its fine structure when compared to a Pt electrode, and has excellent electrical properties due to better electrical conductivity and good heat-transfer properties.

16 Claims, 8 Drawing Sheets

5,751,540

FERROELECTRIC CAPACITOR WITH RHODIUM ELECTRODES

BACKGROUND OF THE INVENTION

The present invention relates to a capacitor with a thin ferroelectric layer, and more particularly, to a ferroelectric capacitor which is used as a memory cell in a ferroelectric random access memory (FRAM).

A ferroelectric capacitor requires electrodes with good electrical conductivity in order to efficiently transfer stored charge. A platinum electrode in general use has problems in that its electrical properties deteriorate due to fatigue of a ferroelectric layer.

Here, an oxygen vacancy is formed at the interface between the platinum (Pt) or platinum/titanium (Pt/Ti) electrode and a ferroelectric material such as PZT ($PbZrTiO_3$), causes an abrupt deterioration in the capacitor's electrical properties. That is, the oxygen vacancy which diffuses from the ferroelectric material accumulates at the interface, thereby decreasing the degree of polarization during polarization inversion and bringing about layer fatigue.

The conductive oxide (e.g., $RuO_2$) electrode is proposed to reduce the phenomenon of the oxygen vacancy aggravating the fatigue by its diffusion into the interface formed in the space-charge area. The conductive oxide electrode has the serious disadvantage of a high leakage current which makes it difficult to apply to a memory element, although the above described layer fatigue phenomenon is retarded. The cause of the leakage current is due to a defect present at the interface between the conductive oxide electrode and the ferroelectric material, whereby the electron barrier height is decreased. More specifically, when PZT is used, the ruthenium (Ru) metal used as the lower electrode diffuses and reacts with lead oxide (PbO) at the boundary of the PZT layer to form a lead-ruthenium oxide ($PbRuO_{3-x}$), which is a conductive material, which reduces the resistance of the thin ferroelectric layer.

In the FRAM structure, a Pt electrode is deposited on a silicon oxide ($SiO_2$) insulating layer. In this case, a thin layer of titanium (Ti) is used as an adhesive layer between the Pt electrode and the $SiO_2$ insulating layer due to the poor adhesive quality between Pt and $SiO_2$. However, Ti has a strong tendency to diffuse through the Pt layer (the lower electrode) is due to its strong affinity for oxygen when PZT or Y1 is deposited, thereby reducing the electrical properties of the PZT or Y1.

SUMMARY OF THE INVENTION

An object of the present invention is to provide a ferroelectric capacitor capable of preventing the deterioration of the ferroelectric properties of the capacitor due to diffusion of Ti.

Another object of the present invention is to provide a ferroelectric capacitor which can be used for an extended period due to reduced layer fatigue.

To achieve the above objects, there is provided a ferroelectric capacitor of the present invention comprising: a substrate; an insulating layer formed on the substrate; a Rhodium (Rh) lower electrode provided on the insulating layer; an adhesive layer between the insulating layer and the Rh lower electrode; a ferroelectric layer provided on the Rh lower electrode; and a Rh upper electrode provided on the ferroelectric layer.

To achieve the above objects, there is provided another ferroelectric capacitor of the present invention comprising: a substrate; an insulating layer formed on the substrate; a Rhodium (Rh) lower electrode provided on the insulating layer; a first adhesive layer between the insulating layer and the Rh lower electrode; a ferroelectric layer provided on the Rh lower electrode; a Rh upper electrode provided on the ferroelectric layer; and a second adhesive layer between the ferroelectric layer and the Rh upper electrode.

In the ferroelectric capacitor according to the present invention, PZT, doped PZT (doped with Nb, La, Zn, Ta, Sc), Y1 ($SrBi_2Ta_2O_9$; SBN, SBT, SBTN) or BST (Barium Strontium Titanate) can be used as the ferroelectric material.

In the ferroelectric capacitors according to present invention, a silicon wafer can be used as the substrate, and the insulating layer is a silicon oxide ($SiO_2$) layer grown to a thickness of about 200 nm.

Further, the adhesive layer of Ti or rhodium oxide ($RhO_2$) or $Rh_2O_3$ or a mixture of $RhO_2$ and $Rh_2O_3$ having a thickness of 20~50 nm is formed by a reactive sputtering method performed in a $Ar/O_2$ mixed gas (weight ratio 7:3~8:2) of which pressure is 5~10 mTorr and preferably 5 mTorr and temperature is 200~300° C., and under a power setting of 300~500 W and preferably 500 W.

The Rh electrode having a thickness of 1,500 nm is formed by a DC magnetron sputtering method performed in an argon atmosphere of 1~20 mTorr and preferably 5~9 mTorr, at a temperature of 200 C, and a power setting of 10~500 W, preferably 300~500 W and more preferably 500 W.

The ferroelectric layer is preferably formed by a sol-gel method. In the formation of the ferroelectric layer, a ferroelectric solution is spin coated to a thickness of 250 nm and then heat-treated at a temperature of 650° C. for about 30 minutes.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
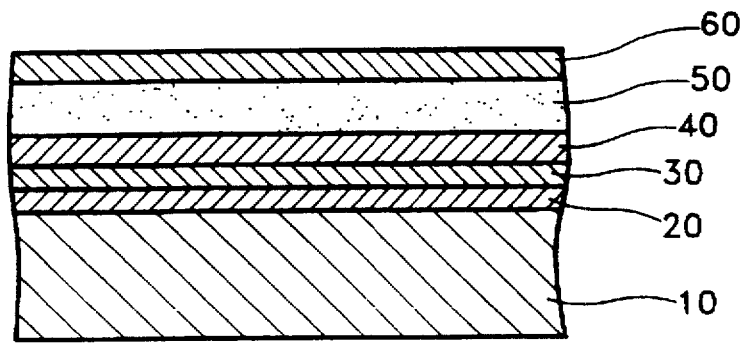
FIG. 1 is a sectional view for roughly showing a ferroelectric capacitor according to a first embodiment of the present invention.

FIG. 1 shows a layered structure of a capacitor according to a first embodiment of the present invention. Here a $SiO_2$ insulating layer 20 having a thickness of about 500 nm is provided on substrate 10 of a silicon wafer. In a FRAM structure, insulating layer 20 is provided for electrical insulation between a transistor (not shown) and a capacitor (described hereinafter).

A thin layer of $RhO_X$ or Ti having a thickness of about 20 nm is formed as an adhesive layer 30 on insulating layer 20. The adhesive layer is provided for improving adhesiveness between the lower insulating layer and the Rh lower electrode 40 (described below).

Rhodium (Rh) lower electrode 40 having a thickness of not more than about 150 nm is formed on top of adhesive layer 30. PZT, Y1 or BST ferroelectric layer 50 having a thickness of not more than 250 nm is formed on lower electrode 40. Finally, Rh upper electrode 60 is formed on ferroelectric layer 50.

Figure 2:
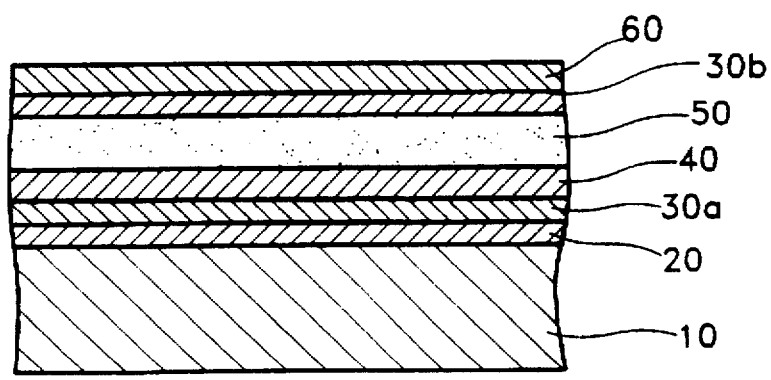
FIG. 2 is a sectional view for roughly showing a ferroelectric capacitor according to a second embodiment of the present invention.

FIG. 2 shows a layered structure of a capacitor according to a second embodiment of the present invention. Here a $SiO_2$ insulating layer 20 having a thickness of about 200–250 nm is provided on substrate 10 of a silicon wafer. In a FRAM structure, insulating layer 20 is provided for electrical insulation between a transistor (not shown) and a capacitor (described hereinafter).

A thin layer of $RhO_X$ or Ti having a thickness of about 20–50 nm is formed as a first adhesive layer 30a on insulating layer 20. The first adhesive layer is provided for improving adhesiveness between the lower insulating layer and the Rh lower electrode 40 (described below).

Rhodium (Rh) lower electrode 40 having a thickness of not more than about 150 nm is formed on top of the first adhesive layer 30a. PZT, Y1 or BST ferroelectric layer 50 having a thickness of not more than 250 nm is formed on lower electrode 40. A second adhesive layer 30b of $RhO_X$ is formed on ferroelectric layer 50. Finally, Rh upper electrode 60 is formed on second adhesive layer 30b.

The capacitor structured as described above according to the second embodiment of the present invention is characterized by using Rh as an electrode. The manufacturing method thereof is as follows.

Figure 3:
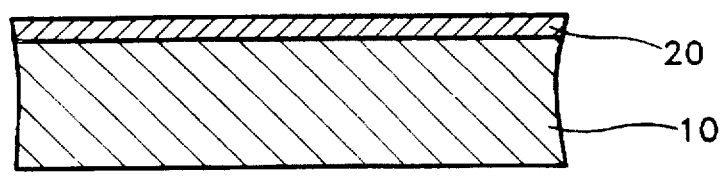
FIGS. 3 through 6 are sectional views illustrating a sequence of a manufacturing method according to the second embodiment of the present invention.
Figure 4:
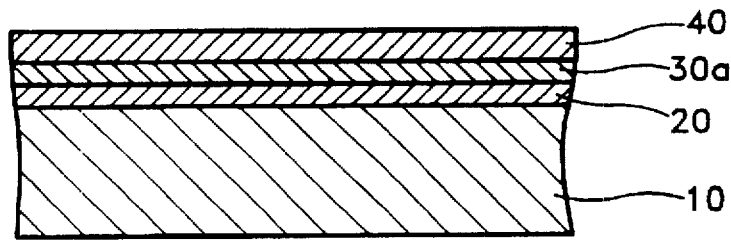

First, referring to FIG. 3, a $SiO_2$ insulating layer 20 is formed on the silicon wafer. A common deposition and oxidation method are used for forming this oxide layer. After forming insulating layer 20, the first adhesive layer 30 of Ti or $RhO_X$ is applied, onto which Rh lower electrode 40 is formed by a deposition process. The DC magnetron sputtering method is used for depositing Rh under the following conditions; a temperature of 200° C., an argon atmosphere of 9.0 mTorr and using a power setting of 500 W, as shown in FIG. 4.

Figure 5:
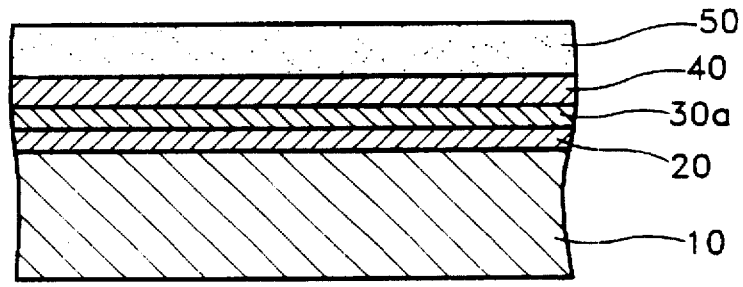

As shown in FIG. 5, the ferroelectric layer is formed on top of lower electrode 40. Here, PZT, Y1, or BST can be used as the material for the ferroelectric layer. A gel-sol method is preferably used to form the ferroelectric layer. In the gel-sol method, the steps of coating the ferroelectric solution using a spin-coater and then baking are repeated several times before a final annealing step is performed, thereby producing a perovskite structure for the ferroelectric material.

Figure 6:
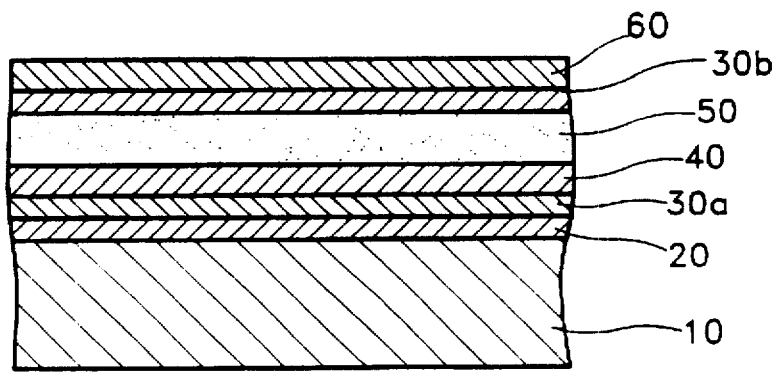

After forming the ferroelectric layer, second adhesive layer 30b and Rh upper electrode 60 is formed by using the same method as for the first adhesive layer and the lower electrode formation shown in FIG. 6.

Referring to the ferroelectric capacitor of the present invention manufactured by the above method, unlikely Pt used as the existing electrode, Rh used as the electrode material reacts with oxygen to form a conductive $RhO_X$ or a mixture of $RhO_2$ and $Rh_2O_3$, which is a physically stable substance, at the interface. According to the present invention, $RhO_X$ used as the adhesive layer strongly adheres between the $SiO_2$ insulating layer and the Rh electrode, and also prevents the diffusion of Pb which is a component of PZT ferroelectric material. The $RhO_X$ adhesive layer is substantially a solid solution of $RhO_2$ and $Rh_2O_3$. Since $Rh_2O_3$ is more stable chemically than $RhO_2$, the higher the content of $Rh_2O_3$, a more enhanced reliability is Rh used as the electrode material is not affected by diffusion of Si because of its fine structure compared with Pt used as the existing electrodes. Rh also has excellent electrical properties due to its better electrical conductivity and good heat-transfer properties. Results of a comparison of the properties of the capacitor of the present invention and the conventional capacitor in which a Pt electrode is used are as follows.

Figure 7:
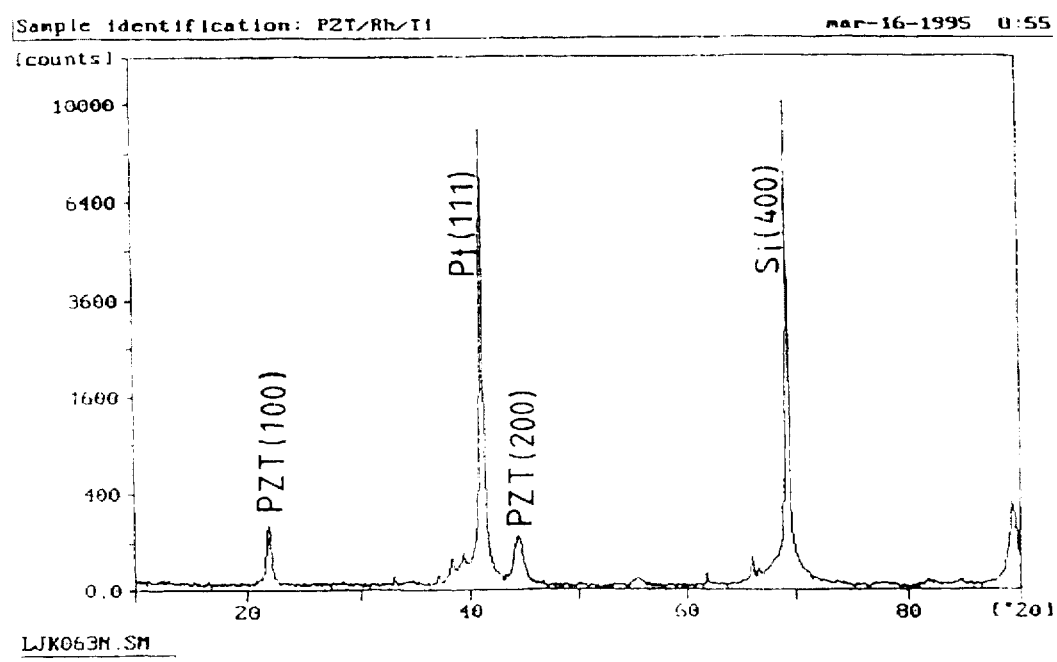
FIG. 7 is an XRD analytical curve of a capacitor according to the present invention.

FIG. 7 shows a XRD analytical curve of a capacitor according to a second embodiment of the present invention. Referring to FIG. 7, when Rh is used as the electrode, PZT is epitaxially grown in the direction of (001), unlikely Pt electrode. Therefore, such grown PZT can reduce a coercive voltage.

Figure 8:
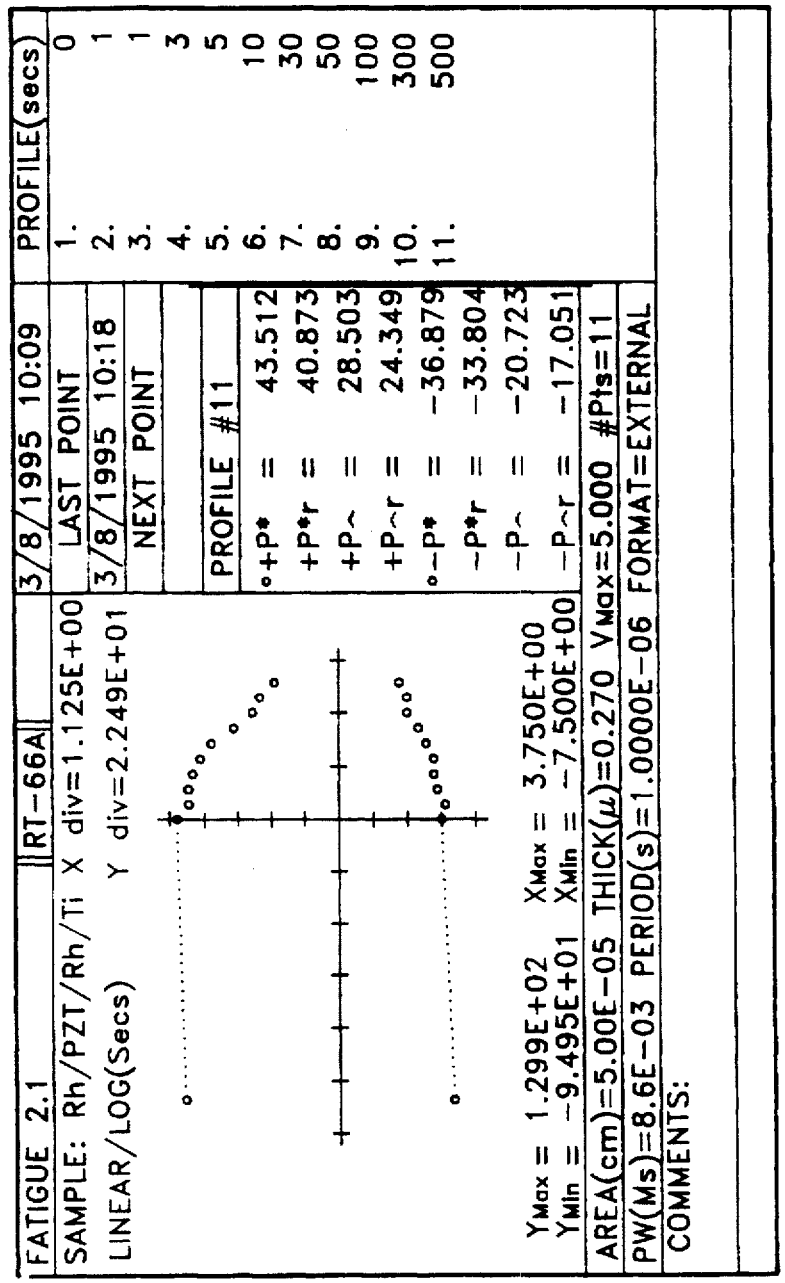
FIGS. 8 and 9 are polarization curves for representing fatigue properties of capacitors according to a first and a second embodiments of the present invention, respectively.
Figure 9:
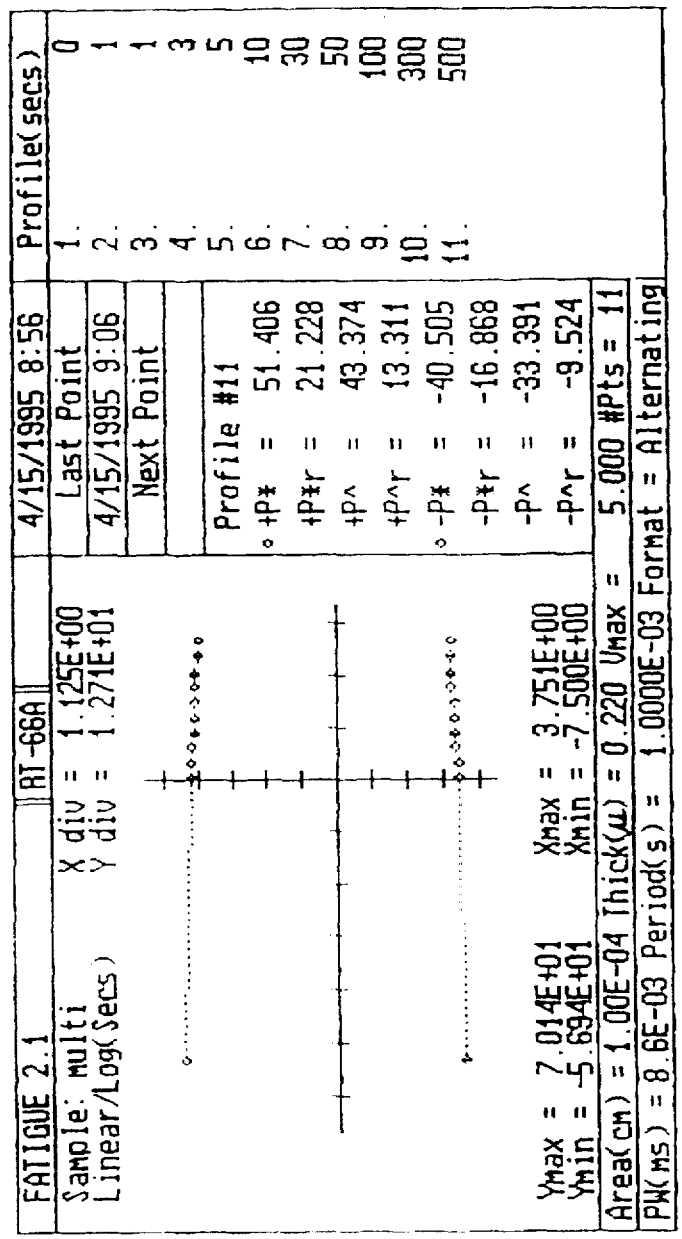
Figure 10:
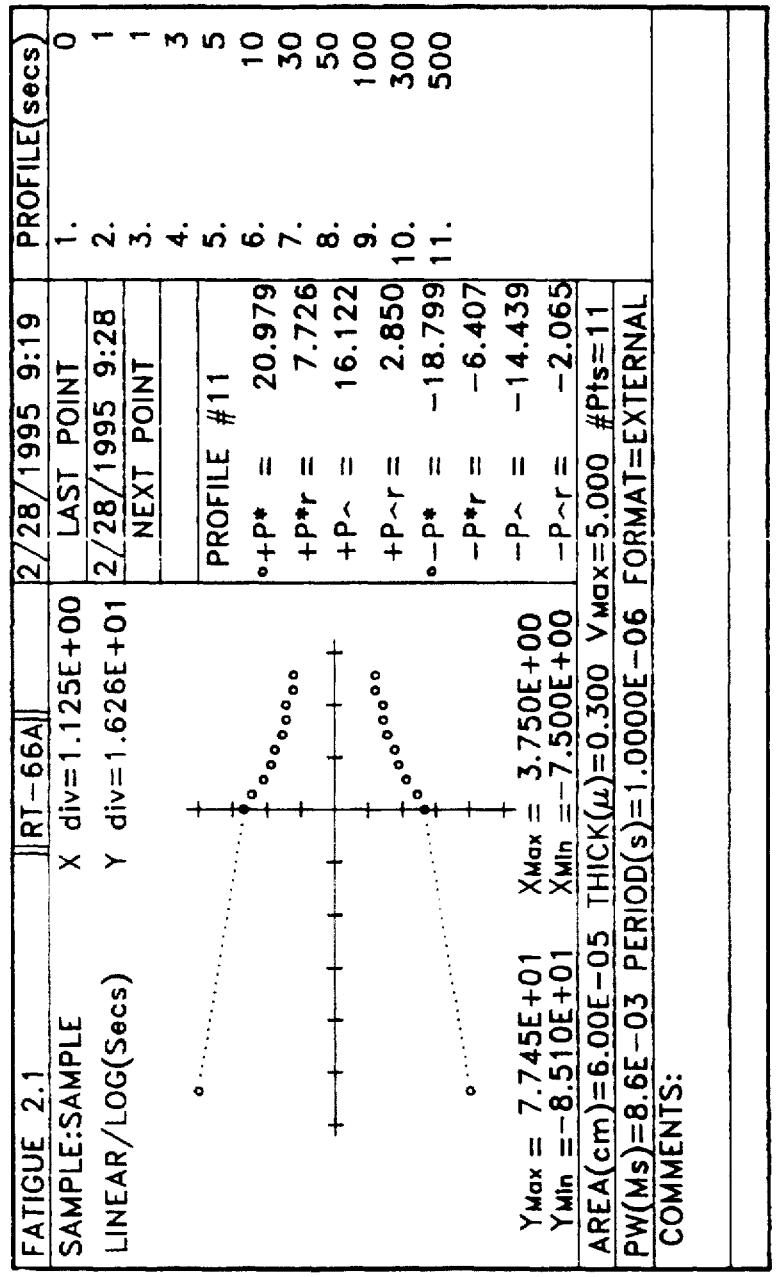
FIG. 10 is a polarization curve for representing a fatigue property of the conventional capacitor.

FIGS. 8 and 9 show fatigue properties of the capacitors according to a first and a second embodiments of the present invention, respectively, and FIG. 10 shows a fatigue property of the conventional capacitor. In the capacitors of the present invention, PZT is used as a ferroelectric layer and Ti or $RhO_2$ is used as an adhesive layer. As shown in FIGS. 8 and 9, the capacitors of the present invention exhibit resistance to the layer fatigue phenomenon when compared with the conventional capacitor shown in FIG. 10. Such beneficial fatigue properties mean that the expected life span of the capacitors of the present invention is longer than that of the conventional capacitor. Referring to FIGS. 8 and 9 in which the abscissa indicates a logarithmic time scale, the polarization values (Y coordinates; units: $\mu C/cm^2$) of the capacitor according to the present invention are kept constant up to the $10^7$ order (FIG. 8) and $10^9$ order then smoothly decline, while the polarization values of the conventional capacitor steadily declines and abruptly falls at the $10^6$ order.

Figure 11:
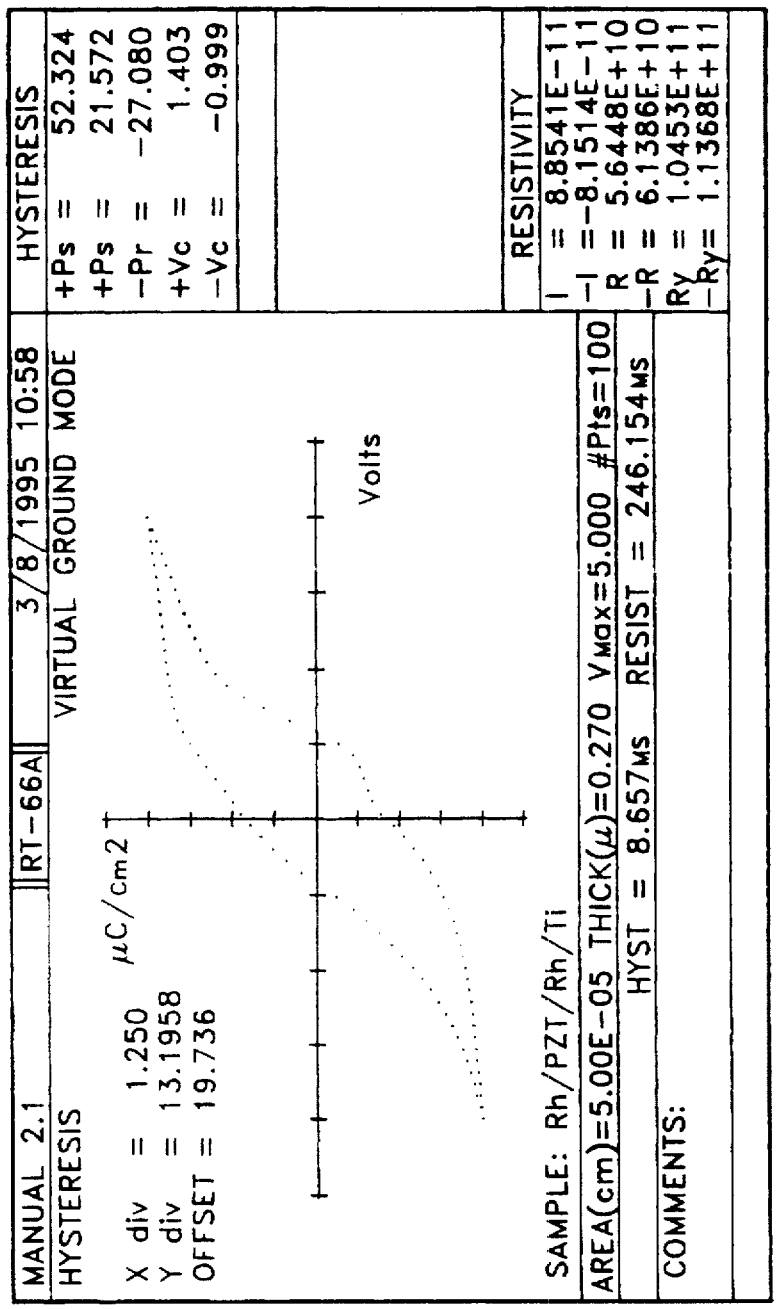
FIG. 11 is a hysteresis curve for showing a hysteresis loop of a capacitor according to a first embodiment of the present invention.
Figure 12:
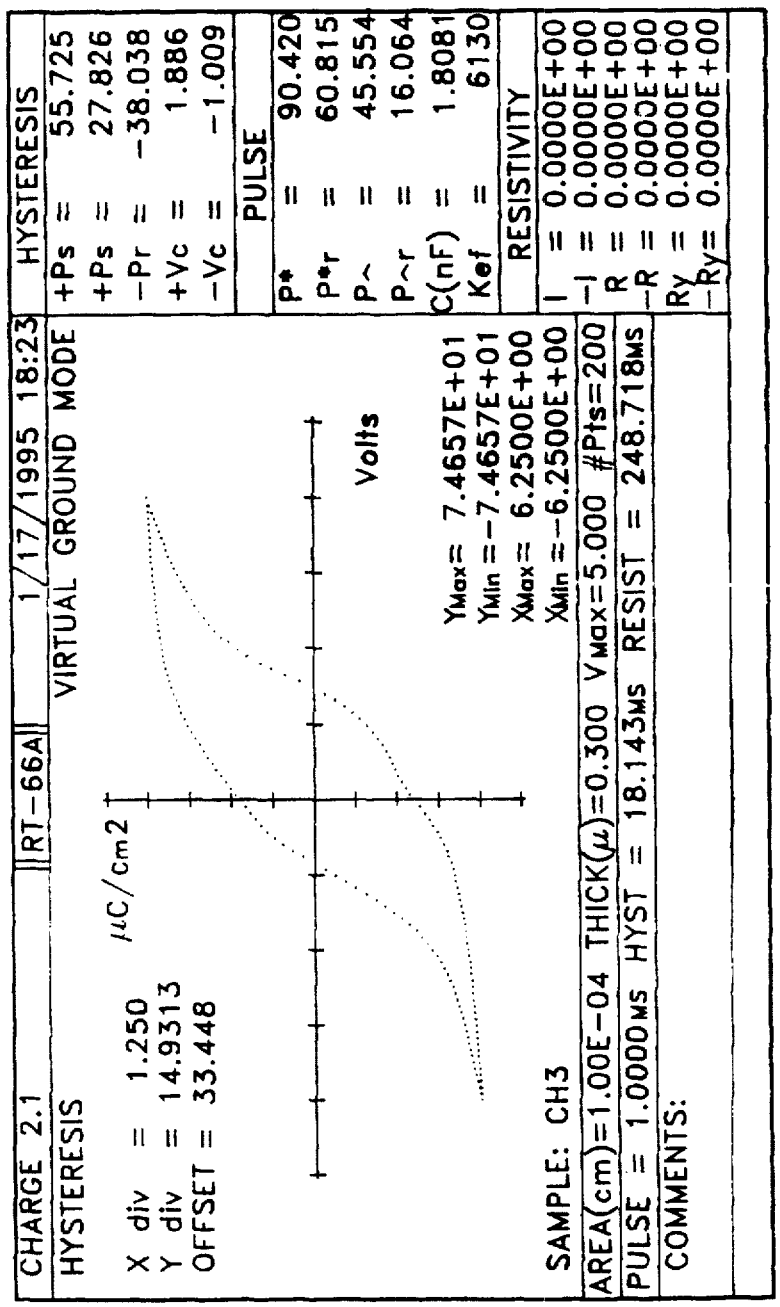
FIG. 12 is a hysteresis curve for showing a hysteresis loop of the conventional capacitor.

FIGS. 11 and 12 are hysteresis loops of the capacitor according to a first embodiment of the present invention and a conventional capacitor. First, referring to FIG. 11, the capacitor according to the first embodiment of the present invention has a negative coercive voltage (−Vc) of −0.999V, a positive coercive voltage (+Vc) of 1.403V, and therefore a total coercive voltage $\{|{-Vc}|+|+Vc|\}$ of about 2.5V. The positive remanent polarization (+Pr) and negative remanent polarization (−Pr) thereof are 21.572 $\mu C/cm^2$ and 27.080 $\mu C/cm^2$, respectively. Referring to FIG. 12, however, the conventional capacitor has a negative coercive voltage (−Vc) of −1.009V, a positive coercive voltage (+Vc) of 1.986V, and therefore a total coercive voltage $\{|{-Vc}|+|+Vc|\}$ of about 3V. The positive remanent polarization (+Pr) and negative remanent polarization (−Pr) thereof are 27.826 $\mu C/cm^2$ and −38.036 $\mu C/cm^2$, respectively. As shown in FIG. 12, the fatigue property is not changed for a long time.

As shown in the above results, when Rh is used as an electrode instead of Pt, and rhodium oxide or Ti is used as an adhesive layer, the resistance to layer fatigue is enhanced and coercive voltage properties are improved.

What is claimed is:

1. A ferroelectric capacitor comprising:

a substrate;

an insulating layer formed on said substrate;

a Rh lower electrode provided on said insulating layer;

a rhodium oxide layer between said insulating layer and said Rh lower electrode;

a ferroelectric layer provided on said Rh lower electrode; and a Rh upper electrode provided on said ferroelectric layer.

2. A ferroelectric capacitor as claimed in claim 1, wherein the material of said insulating layer is $SiO_2$.

3. A ferroelectric capacitor as claimed in claim 2, wherein said ferroelectric layer is any one selected from the group consisting of PZT, Y1 and BST.

4. A ferroelectric capacitor as claimed in claim 1, wherein said rhodium oxide is $RhO_2$.

5. A ferroelectric capacitor as claimed in claim 1, wherein said rhodium oxide is $Rh_2O_3$.

6. A ferroelectric capacitor as claimed in claim 1, wherein said rhodium oxide is a mixture of $RhO_2$ and $Rh_2O_3$.

7. A ferroelectric capacitor as claimed in claim 1, wherein said ferroelectric layer is any one selected from the group consisting of PZT, Y1 and BST.

8. A ferroelectric capacitor as claimed in claim 1, wherein said ferroelectric layer is PZT doped with any one selected from the group consisting of Nb, La, Zn, Ta, Sc.

9. A ferroelectric capacitor as claimed in claim 1 wherein said ferroelectric layer is PZT doped with any one selected from the group consisting of Nb, Zn, Ta, and Sc.

10. A ferroelectric capacitor comprising:

a substrate;

an insulating layer formed on said substrate;

a RH lower electrode provided on said substrate;

a first rhodium oxide layer between said insulating layer and said Rh lower electrode;

a ferroelectric layer provided on said Rh lower electrode;

a second rhodium oxide layer formed on said ferroelectric layer; and a Rh upper layer provided on the second layer.

11. A ferroelectric capacitor as claimed in claim 10, wherein the material of said insulating layer is $SiO_2$.

12. A ferroelectric capacitor as claimed in claim 11, wherein said ferroelectric layer is any one selected from the group consisting of PZT, Y1 and BST.

13. A ferroelectric capacitor as claimed in claim 10, wherein said ferroelectric layer is any one selected from the group consisting of PZT, Y1 and BST.

14. A ferroelectric capacitor as claimed in claim 10, wherein said rhodium oxide is $RhO_2$.

15. A ferroelectric capacitor as claimed in claim 10, wherein said rhodium oxide is $Rh_2O_3$.

16. A ferroelectric capacitor as claimed in claim 10, wherein said rhodium oxide is a mixture of $RhO_2$ and $Rh_2O_3$.

* * * * *

UNITED STATES PATENT AND TRADEMARK OFFICE
CERTIFICATE OF CORRECTION

PATENT NO. : 5,751,540
DATED : May 12, 1998
INVENTOR(S) : June-key Lee et al.

It is certified that error appears in the above-indentified patent and that said Letters Patent is hereby corrected as shown below:

Col. 4, line 10, after "is" insert --attained.--.

Signed and Sealed this

Third Day of November, 1998

Attest:

BRUCE LEHMAN

Attesting Officer

Commissioner of Patents and Trademarks